June 30, 1964 J. H. BROWN 3,139,590

A.C. AMPLIFIER WITH ZERO D.C. OFFSET

Filed May 4, 1962

INVENTOR.
JAMES H. BROWN

BY O. P. Hodges ATTY.

P. R. Harder AGENT.

United States Patent Office 3,139,590

Patented June 30, 1964

3,139,590

A.C. AMPLIFIER WITH ZERO D.C. OFFSET

James H. Brown, Severna Park, Md., assignor, by mesne assignments, to the United States of America as represented by the Secretary of the Navy Filed May 4, 1962, Ser. No. 192,612
5 Claims. (Cl. 330—9)

The present invention relates to a wide band A.C. amplifier and more particularly to a wide band A.C. amplifier having zero D.C. offset.

In many digital data processing systems it becomes necessary to amplify a repetitive unipolar square wave which may have a duty cycle as high as 80% with an "on" time from as little as 100 microseconds or less and in other applications may be as great as 5.0 milliseconds depending on the low frequency response of the amplifier. In most practical applications, however, the "on" time of the square wave and, therefore, of the amplifier will be in the 100 microsecond or less region. Amplifiers utilized to amplify such a square wave must follow the input to very close tolerances. This means that the amplifier must have a wide frequency band pass for rapid rise time, a good low frequency response to prevent "sag" of the square wave, and the output of the amplifier must return to ground when the input signal returns to ground.

A conventional well designed A.C. amplifier will fulfill the first two requirements, i.e., it has a wide frequency band pass and good low frequency response, but has not been able to satisfactorily fulfill the third requirement for the reason that when repetitive square waves of the same polarity are supplied to the input a charge accumulates on the output capacitance of the amplifier resulting after a period of time in a D.C. offset in the output signal.

The general purpose of this invention is to provide a wide band A.C. amplifier which embraces all of the aforedescribed requirements when utilized to amplify a repetitive unipolar square wave. To attain this, the present invention contemplates a unique clamping arrangement in the input and output circuits of the amplifier whereby any accumulated charge is eliminated during the "off" time between each square wave or input pulse.

An object of the present invention is to provide a wide band A.C. amplifier capable of amplifying a repetitive unipolar square wave to very close tolerances.

Another object is to provide a wide band A.C. amplifier which has a wide frequency bandpass, good low frequency response and which is able to return the output signal to ground when the input signal returns to ground.

A further object is the provision of a switching or clamping system for use with an amplifier that eliminates, during the "off" time of the amplifier, the charge accumulated on the input or output terminals.

Still another object is to provide a new and improved electronic switch for electrically connecting and disconnecting a pair of terminals in response to an electrical signal.

Other objects and many of the attendant advantages of this invention will be more readily appreciated as the same becomes better understood by reference to the following detailed description when considered in connection with the accompanying drawing in which like reference numerals designate like parts throughout the figures thereof and wherein.

Figure 1:
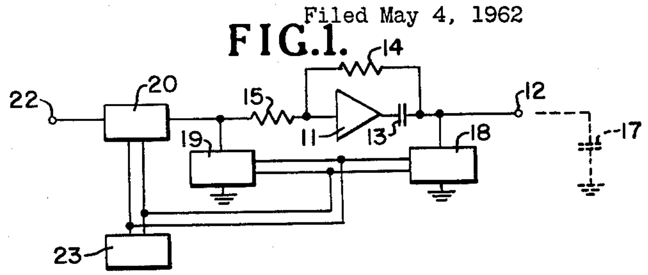
FIG. 1 illustrates in block diagram form a preferred embodiment of the invention.

Referring now to FIG. 1 there is illustrated an A.C. amplifier 11 capacitively coupled to output terminal 12 by way of capacitor 13 and having a feedback resistor 14 and an input resistor 15. Capacitor 17, illustrated in phantom, represents stray shunt capacitance of the next succeeding stage or may represent the charge built up on a long coaxial cable connecting the output of amplifier 11 to a remote load.

In digital processing systems and elsewhere it is necessary to amplify a repetitive unipolar pulse and as a result of the stray capacitance 17, the output capacitance of amplifier 11 or the input capacitance of the next succeeding stage, a charge is built up over a period of time which prevents the output terminal 12 of amplifier 11 from returning to ground even though the input signal returns to ground thereby resulting in a D.C. offset. Likewise, a charge may be built up at the input to amplifier 11 which again results in a D.C. offset at the output terminal.

In order to prevent an accumulation of any charge on the output or input terminals on the amplifier, applicant's invention utilizes a plurality of switches 18, 19 and 20, switch 18 being connected between the output terminal 12 and ground, switch 19 being connected between the input side of resistor 15 and ground while switch 20 is connected in series between the input side of resistor 15 and the input terminal 22. Switches 18, 19 and 20 are operated in such a manner that when switches 18 and 19 are open, switch 20 is closed, and when switch 20 is open, switches 18 and 19 are closed. Switch 20 is further operated such that the switch is closed during the period of time the input pulses are present and opened during the period of time between pulses. Therefore, switches 18 and 19 are open during the pulses and closed for a period of time between the input pulses, thus shorting to ground both the input and the output terminals of amplifier 11 to allow any charge accumulated thereon to be discharged to ground. Just prior to the occurrence of the next succeeding pulse, switches 18 and 19 open and switch 20 closes and the pulse is amplified as though switches 18, 19 and 20 were not present. Switches 18, 19 and 20 are driven by a single switch driver source 23 connected to the respective switches in such a manner that the foregoing operation will result, this connection being more fully explained in the description of FIG. 2. The switch driver 23 may be a bistable multivibrator having its outputs symmetrical about ground such that in one state one terminal is positive with respect to ground and the other terminal is negative with respect to ground and in its other state the polarities of the terminals are reversed.

Switch 20 is utilized to isolate the input terminal 22 from the system while switch 19 is closed to prevent any excess loading on the signal source should the input to the amplifier be normally biased either positively or negatively. If the amplifier is utilized to amplify a plurality of inputs on a time-share basis, as, for example, in a multiplexing system, an appropriate number of switches 20 may be added between the various input terminals and the input side of input resistor 15 and selectively closed at the appropriate time, it being obvious that switches 18 and 19 are open any time one of the switches 20 is closed. On the other hand, if the multiplexing takes place ahead of input terminal 22 only one switch would be necessary.

Figure 2:
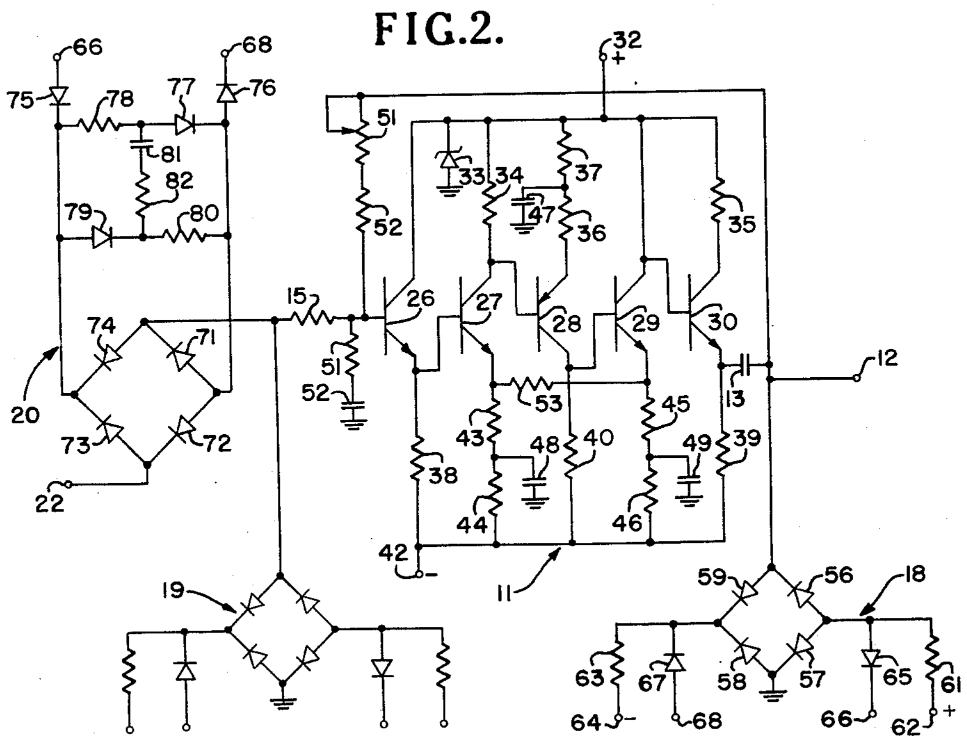
FIG. 2 illustrates a schematic diagram of an amplifier and its associated switches that is capable of performing the foregoing objects.

Referring now to FIG. 2 there is illustrated in greater detail one embodiment of a wide band A.C. amplifier having good low frequency response and its associated switches. The circuit illustrated in FIG. 2 is capable of appropriately switching a ±1.5 volt input pulse and amplifying this pulse to ±20.0 volts with an accuracy of 0.1% over a temperature range from −55° C. to +100° C. The amplifier is direct coupled throughout except that the last stage is capacitively coupled to the output terminal 12 by capacitor 13.

The amplifier 11 includes a pair of NPN transistors 26 and 27, a PNP transistor 28 and a pair of NPN transistors 29 and 30 directly coupled in cascade. Transistors 26 and 29 have their respective collectors connected directly to the positive terminal 32 of a power source, this positive potential being stabilized above ground by Zener diode 33. The collectors of transistors 27 and 30 are respectively connected through resistors 34 and 35 to the positive terminal 32 while transistor 28 has its emitter connected through the series combination of resistors 36 and 37 to positive terminal 32. The emitter of transistors 26 and 30 and the collector of transistor 28 are respectively connected through resistors 38, 39 and 40 to the negative terminal 42 of the power supply. The emitters of transistors 27 and 29 are respectively connected through the series combination of resistors 43 and 44 and through the resistors 45 and 46 to the negative terminal 42. Respectively connected between the junction of resistors 36 and 37, resistors 43 and 44, and resistors 45 and 46 and ground are emitter bypass capacitors 47, 48 and 49.

The base of transistor 26 is connected through input resistor 15 and switch 20 to input terminal 22 and is also connected through the series combination of resistor 51 and capacitor 52 to a point of ground potential. The base of transistor 27 is directly connected to the emitter of transistor 26 while the bases of transistors 28, 29 and 30 are directly connected to the collectors of transistors 27, 28 and 29 respectively. Variable resistor 51 connected in electrical series circuit with fixed resistor 52 between the output terminal 12 and the base of transistor 26 forms a major feedback loop for A.C. gain stabilization while resistor 53 connected between the emitters of transistors 27 and 29 forms a minor feedback loop for D.C. stabilization.

In operation, if a positive pulse is applied to the base of transistor 26 the collector to emitter impedance decreases and a positive going signal is supplied to the base of transistor 27. A positive going signal on the base of transistor 27 is reflected as a negative going signal at its collector which increases the conduction of transistor 28 thereby driving its collector in a positive direction. A positive going signal at the base of transistor 29 is reflected at its collector as a negative going signal which tends to decrease the conduction of transistor 30 thereby driving its emitter in the negative going direction. This negative going signal is coupled to output terminal 12 by a coupling capacitor 13 and the positive going pulse at the input to the amplifier 11 is reflected and amplified as a negative going pulse at the output terminal 12.

A preferred embodiment of switches 18, 19 and 20 is also illustrated in FIG. 2, switches 18 and 19, being the clamping switches, have identical circuits and identical functions at the input and output of the amplifier, i.e., to clamp these points to ground during the "off" period of the amplifier between pulses. Since switches 18 and 19 are identical in structure and operation only the details of switch 18 and the operation thereof will be described. Clamping switch 18 has a plurality of diodes 56, 57, 58 and 59, the anodes of diodes 56 and 57 and the cathodes of diodes 58 and 59 being respectively connected together while the cathode of diode 57 is connected to the anode of diode 58 and the cathode of diode 56 is connected to the anode of diode 59 to form a conventional diode bridge circuit. The anodes of diodes 56 and 57 are connected through resistors 61 to the positive terminal 62 of a floating power supply while the cathodes of diodes 58 and 59 are connected through resistor 63 to the negative terminal 64 of the floating power supply. Diode 65 has its anode connected to the junction of diodes 56, 57 and resistor 61 and its cathode connected to the output terminal 66 of a switch driver source while diode 67 has its cathode connected to the junction between diodes 58, 59 and resistor 63 and its anode connected to the other terminal 68 of the switch driver source. The junction between diodes 56 and 59 is directly connected to the output terminal 12 of amplifier 11 and the junction between diodes 57 and 58 is connected to ground.

As has been noted in the description of FIG. 1, the switch driver may be a bistable multivibrator having outputs symmetrical about ground and respectively connected to terminals 66 and 68 in such a manner that when terminal 66 is positive, terminal 68 is negative, both with respect to ground, and when terminal 68 is positive terminal 66 is negative. In operation, when the voltage at switch driver terminal 66 is positive and the voltage at terminal 68 is negative, diodes 65 and 67 are reverse biased and no conduction can occur therethrough. Under this condition, current flows from terminal 62 of the floating power supply to negative terminal 64 and the diodes in the bridge circuit of switch 18 are conductive and the potential at the junction of diodes 56 and 59, and therefore the potential of output terminal 12, will be held very close to the potential at the junction of diodes 57 and 58. In other words, when the diodes in the bridge circuit are conductive and the switch is closed, the output terminal 12 of amplifier 11 is clamped very close to ground potential and any charge that may have accumulated at terminal 12 is drained off to ground.

When the multivibrator changes states and terminal 68 is positive and terminal 66 is negative, diodes 65 and 67 conduct and clamp the junction of diodes 56 and 57 to a negative potential and the junction of diodes 58 and 59 to a positive potential. Since the anodes of diodes 56 and 57 are now negative and the cathodes of diodes 58 and 59 are positive no current can flow through the diode bridge, the switch is open and represents a high impedance between output terminal 12 and ground potential. Under this condition, the output of amplifier 11 is unaffected by the presence of switch 18.

Switch 19 is of identical construction and operation as that of switch 18 and is connected between the input side of resistor 15 and ground and therefore when the output terminal of amplifier 11 is clamped to ground by closing of switch 18 the input side of input resistor 15 is also clamped to ground thereby bleeding off any charge accumulated at the input of the amplifier.

As has been hereinbefore pointed out, when the input and output of the amplifier are clamped to ground it is desirable to disconnect the input of the amplifier from the input source to prevent undesirable loading thereof. This function is accomplished by switch 20 connected in series between the input terminal 22 and the input resistor 15. Diodes 71, 72, 73 and 74 in switch 20 form a diode bridge circuit by respectively connecting together the anodes of diodes 71 and 72, the cathodes of diodes 73 and 74, the cathode of diode 72 and the anode of diode 73, and the cathode of diode 71 and the anode of diode 74. The junction between diodes 71 and 74 is directly connected to the input side of resistor 15 and the junction of diodes 72 and 73 is directly connected to the input terminal 22 thereby forming a diode switch between terminal 22 and the input side of resistor 15. Diode 75 has its cathode connected to the junction of diodes 73 and 74 and its anode connected to terminal 66 of the switch driver source while diode 76 has its anode connected to the junction of diodes 71 and 72 and its cathode connected to the terminal 68 of the switch driver source. Diode 77 has its cathode connected to the anode of diode 76 and its anode connected through resistor 78 to the cathode of diode 75 and diode 79 has its anode connected to the cathode of diode 75 and its cathode connected through resistor 80 to the anode of diode 76. Capacitor 81 and resistor 82 are serially connected between the junction of diode 77 and resistor 78 and the junction of diode 79 and resistor 80.

As has been hereinbefore pointed out, when the terminal 66 of the switch driver is positive, the terminal 68 is negative and under this condition current flows from terminal 66 through diode 75, resistor 78, diodes 77 and 76 to terminal 68 and, due to the small drop across diodes 77 and 76, the junction of capacitor 81, diode 77 and resistor 78 is substantially the same as the negative potential at terminal 68. Current also flows from terminal 66 through diodes 75 and 79, resistor 80 and diode 76 to terminal 68 and because of the small voltage drop across diodes 75 and 79 the junction of diode 79, resistor 80 and resistor 82 is substantially the positive potential of terminal 66. Under this condition, current flows from the cathode of diode 79 through resistor 82 and capacitor 81 to the anode of diode 77 to charge capacitor 81. Further, since the voltage drop across diode 75 and 76 is small, the cathodes of diodes 73 and 74 are positive and the anodes of diodes 71 and 72 are negative, therefore, the diode bridge is reverse biased or the switch is opened. Since the diode bridge is nonconductive it represents an open circuit between terminal 22 and the input side of resistor 15 and the signal source connected to terminal 22 is disconnected from the amplifier 11.

When the polarity of terminals 66 and 68 reverses under the control of the switch driver, i.e., when terminal 66 is negative and terminal 68 is positive, diodes 75 and 76 are reverse biased and represent an open circuit. Since capacitor 81 has been charged during the preceding cycle the voltage at the anode of diode 77 is negative while the voltage at the cathode of diode 79 is positive and therefore these diodes are also reverse biased. The junction of diodes 71 and 72 is now positive with respect to the junction of diodes 73 and 74 and the capacitor 81 discharges through resistors 82, 80, the diode bridge and resistor 78. When the diodes in the bridge are conductive the voltage drop across them is very small, the switch is closed and the junction between diodes 71 and 74 will follow the potential applied at input terminal 22 and therefore connects the input signal to the input resistor 15 of amplifier 11.

Since the switches 18, 19 and 20 are all driven by a common switch driver and terminals 66 and 68 are common to each, the desired operation pointed out in connection with FIG. 1 is obtained since when terminal 66 is positive and terminal 68 is negative, switches 18 and 19 are closed and switch 20 is open, and when terminal 66 is negative the terminal 68 is positive switches 18 and 19 are open and switch 20 is closed. Further, diodes 65, 67, 75 and 76 operate under the appropriate bias to isolate the switch driver source from the respective switches.

As has been hereinbefore stated, the switch driver may be a bistabled multivibrator having its outputs symmetrical to ground. In practice, the magnitude of the outputs in both polarities should be slightly higher than the input signal magnitude to the amplifier and the multivibrator should be capable of supplying proper conduction current to the diode bridge switches. The diode switch 20 will remain closed so long as the charge on capacitor 81 remains above the conduction level of the diodes and in most applications, this period will usually not exceed 500 microseconds. By arrangement of the value of resistors 78, 80 and 82, the value of capacitor 81 and the magnitude of the switch driver output, the closed time of diode switch 20 may be varied to accommodate various periods depending on the duty cycle of the amplifier. Likewise, depending on the duty cycle of the amplifier, switches 18 and 19 may be closed for longer periods of time than the closed period of switch 20 in order to maintain the output and input terminals of the amplifier 11 clamped to ground for the longest period of time possible.

The diodes in all of the bridges are preferably matched to provide minimum offset, it being obvious in regard to bridges 18 and 19 that if the diodes are correctly matched, the bridge is balanced and the potential at the junction of diodes 56 and 59 will be the same as that between diodes 57 and 58, in other words, at ground potential. In practice, however, it is difficult to obtain perfect matching of the diodes therefore resulting in some offset from the desired potential. If offsets closer to zero are required than can be obtained with the diode bridge, a trimming potentiometer may be utilized in the bridges to provide these lower offsets, an example of which is illustrated in FIG. 3.

Figure 3:
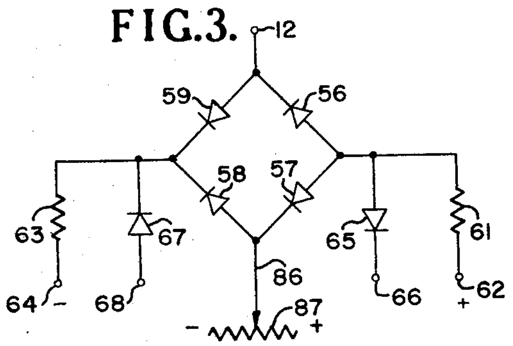
FIG. 3 is a modification of one of the switches illustrated in FIG. 2.

Referring now to FIG. 3, there is illustrated a second embodiment of the switches 18 and 19 identical in construction and operation to the switch 18 hereinbefore described in connection with FIG. 2 except that the junction of diodes 57 and 58 is connected to the moveable tap 86 of potentiometer 87. One end of potentiometer 87 is connected to a potential that is positive with respect to ground and the other end is connected to a potential that is negative with respect to ground. Thus, at one point along the potentiometer the contact will be at ground potential and the circuit is the same as that illustrated in connection with FIG. 2. If, due to an imperfect match in the diodes of the bridge, the potential at terminal 12 is either positive or negative with respect to ground the contact 86 may be moved along the potentiometer in the appropriate direction to compensate for this undesired offset thereby raising or lowering the potential at terminal 12 until ground potential is obtained.

There has been illustrated and described an improved wide band A.C. amplifier particularly adapted to the amplification of a repetitive unipolar pulse commonly encountered in data processing systems which by the incorporation of a plurality of switches operates to disconnect the input of the amplifier from the signal source during the "off" duty cycle of the amplifier and at the same time grounding both the input and the output of the amplifier to drain off any charge accumulated in shunt capacitance across the input or the output of the amplifier thereby preventing any accumulation of such charge which would result in a D.C. offset at the input or output of the amplifier. There has further been described a plurality of electronic switches suitable for use with the amplifier that conveniently produce the appropriate switching desired.

While the invention has been illustrated and described in connection with a single embodiment thereof, many modifications and variations of the present invention are obvious in light of the foregoing description. It is therefore, to be understood that the invention may be practiced otherwise than as specifically described and illustrated without departing from the true spirit and scope of the invention as set forth in the appended claims.

What is claimed as new and desired to be secured by Letters Patent of the United States is:

1. In combination, an amplifier having an input terminal and an output terminal, a point of reference potential, first electrical switch means connected between said output terminal and said point of reference potential, second electrical switch means connected between said input terminal and said point of reference potential, a signal source, third electrical switch means connected between said signal source and said input terminal, first, second and third means respectively connected to said first, second and third electrical switch means for selectively opening and closing said first, second and third switch means in response to a first and second switch driver signal, said first, second, and third means operating to close said first and said second switch means and open said third switch means in response to a first common signal and to open said first and said second switch means and close said third switch means in response to a second common signal.

2. The combination of claim 1 wherein said first and said second switch means each comprises a diode bridge, a floating power supply connected across one pair of terminals of said diode bridge, and said first and said second means each comprises a pair of diodes respectively connected to said one pair of terminals for reverse biasing said diode bridge in response to said second common signal.

3. The combination of claim 2 wherein said third switch means comprises a diode bridge and said third means comprises a pair of diodes, a capacitor, means connecting said capacitor across said pair of diodes for charging said capacitor, means connecting said pair of diodes to said diode bridge for reverse biasing said diode bridge during the charging of said capacitor, and means connecting said capacitor across said diode bridge for discharging said capacitor through said diode bridge whereby said diode bridge is forward biased during the discharge of said capacitor.

4. A system for amplifying a repetitive pulse without any appreciable D.C. offset comprising an amplifier having an input terminal and an output terminal, a point of reference potential, first switch means connected to said output terminal and said point of reference potential, second switch means connected to said input terminal and said point of reference potential, a switch driver source having a first and a second output state, means connecting said switch driver source to said first and second switch means for closing said first and said second switch means when said switch driver source is in said first state and for opening said first and said second switch means when said switch driver source is in said second state, third switch means connected in electrical series circuit with said input terminal, means connecting said third switch means and said switch driver source for opening said switch means when said switch driver source is in said first state and for isolating said switch driver source from said third switch means when said switch driver source is in said second state.

5. The device of claim 4 wherein said last-named means further includes means for closing said third switch means when said switch driver source is in said second state.

References Cited in the file of this patent

UNITED STATES PATENTS

| | | |
|---|---|---|
| 2,754,374 | Enright | July 10, 1956 |
| 2,885,663 | Curtis | May 5, 1959 |
| 3,028,487 | Losee | Apr. 3, 1962 |
| 3,071,701 | Perreault | Jan. 1, 1963 |

FOREIGN PATENTS

| | | |
|---|---|---|
| 754,945 | Great Britain | Aug. 15, 1956 |
| 856,749 | Great Britain | Dec. 21, 1960 |